United States Patent [19]
Nitta et al.

[11] Patent Number: 5,926,497
[45] Date of Patent: Jul. 20, 1999

[54] DIFFRACTION GRATING WITH ALTERNATELY-ARRANGED DIFFERENT REGIONS, OPTICAL SEMICONDUCTOR DEVICE WITH THE DIFFRACTION GRATING, AND APPARATUS AND OPTICAL COMMUNICATION SYSTEM USING THE SAME

[75] Inventors: Jun Nitta, Ninomiya-machi; Yuichi Handa, Atsugi; Hidetoshi Nojiri, Hadano, all of Japan

[73] Assignee: Canon Kabushiki Kaisha, Tokyo, Japan

[21] Appl. No.: 08/816,335

[22] Filed: Mar. 13, 1997

[30] Foreign Application Priority Data

Mar. 19, 1996 [JP] Japan .................................. 8-090365
Feb. 20, 1997 [JP] Japan .................................. 9-052360

[51] Int. Cl.⁶ ........................................................ H01S 3/19
[52] U.S. Cl. ................................ 372/96; 372/45; 372/50; 372/102
[58] Field of Search ................................ 372/45, 50, 96, 372/27, 102

[56] References Cited

U.S. PATENT DOCUMENTS

| | | | |
|---|---|---|---|
| 5,117,469 | 5/1992 | Cheung et al. | 372/45 |
| 5,155,737 | 10/1992 | Ikeda et al. | 372/102 |
| 5,208,824 | 5/1993 | Tsang | 372/45 |
| 5,289,494 | 2/1994 | Tada et al. | 372/45 |
| 5,471,335 | 11/1995 | Nitta | 359/179 |
| 5,574,289 | 11/1996 | Aoki et al. | 372/50 |
| 5,586,131 | 12/1996 | Ono et al. | 372/27 |
| 5,606,176 | 2/1997 | Nitta | 257/18 |

FOREIGN PATENT DOCUMENTS

| | | |
|---|---|---|
| 2159781 | 6/1990 | Japan . |
| 5129719 | 5/1993 | Japan . |

*Primary Examiner*—Rodney Bovernick
*Assistant Examiner*—Yisun Song
*Attorney, Agent, or Firm*—Fitzpatrick, Cella, Harper & Scinto

[57] ABSTRACT

A diffraction grating includes first regions for mainly reflecting first polarized light and second regions for mainly reflecting second polarized light. The first regions and the second regions are alternately arranged in a light propagation direction in a variety of manners to appropriately set its polarization-mode dependency according to need. An optical semiconductor device includes a semiconductor substrate, a laser structure and that diffraction grating formed in the laser structure. The laser structure is a distributed feedback semiconductor laser structure or a distributed Bragg reflector semiconductor laser structure formed on the semiconductor substrate.

22 Claims, 8 Drawing Sheets

DIFFRACTION GRATING WITH ALTERNATELY-ARRANGED DIFFERENT REGIONS, OPTICAL SEMICONDUCTOR DEVICE WITH THE DIFFRACTION GRATING, AND APPARATUS AND OPTICAL COMMUNICATION SYSTEM USING THE SAME

BACKGROUND OF THE INVENTION

1. Field of the Invention

The present invention relates to a diffraction grating with alternately-arranged different regions having different polarization dependencies, a semiconductor optical device with this diffraction grating, such as a distributed feedback semiconductor laser, a distributed Bragg reflector semiconductor laser and an optical amplifier whose polarization dependency of its amplification factor is reduced. The present invention also relates to a light transmitter, a light receiver and an optical communication system using the semiconductor optical device of this invention.

2. Related Background Art

Conventionally, as an oscillation polarization-mode switchable semiconductor laser whose polarization mode of output light can be changed between a transverse electric (TE) mode and a transverse magnetic (TM) mode depending on its stimulated condition, the following device has been developed and proposed. This is disclosed in Japanese Laid-Open Patent Application No. 2-159781 and is a three-electrode, buried-type distributed feedback (DFB) semiconductor laser which has an active layer of bulk crystal and a diffraction grating with a $\lambda/4$ shift section, for example. In this semiconductor laser, since the active layer is composed of the bulk crystal, amplification factors for light in the TE mode and light in the TM mode are substantially equal to each other. In this structure, thresholds for light in the TE mode and light in the TM mode are varied by controlling the amount of current injected into a region with the $\lambda/4$ shift section, and light in a polarization mode having the lower threshold value is oscillated and output therefrom.

Thus, in order that the polarization mode of the output light is varied depending on the stimulated condition, the amount of carriers injected into the $\lambda/4$ phase shift region, in which the polarization-mode dependency of the amplification factor and loss of the active layer are small, is changed, and hence the radiative wavelength, at which the round-trip phase matching condition is satisfied for each of the TE mode and the TM mode, is changed. Accordingly, the threshold values for the TE mode and the TM mode are changed and the relationship of magnitude therebetween is alternately reversed.

Further, Japanese Laid-Open Patent Application No. 5-129719 discloses a distributed feedback semiconductor laser in which a diffraction grating is formed using a strained superlattice. In this structure, the strained superlattice layer having a lattice constant different from its substrate is periodically formed with a pitch of the diffraction grating and periodical portions of a quantum well active layer formed on the strained superlattice layer are subjected to strain of the periodically-formed strained superlattice layer. Thus, the quantum well active layer is composed of periodical portions subjected to the strain and the other portions without any strain to substantially form the diffraction grating, so that a gain-coupling type DFB semiconductor laser is built.

The device disclosed in Japanese Laid-Open Patent Application No. 2-159781, however, has a drawback that its operation current is large since the active layer is composed of the bulk crystal.

Further, in the device disclosed in Japanese Laid-Open Patent Application No. 5-129719, although the operation current is lowered since the active layer has the quantum well structure, it is difficult to regulate the relationship between gains for the TE mode and the TM mode (for example, both are made equal, or one is larger than the other) because the quantum well active layer undergoes the strain only indirectly. Hence, a stable polarization-mode modulation is hard to attain therein.

SUMMARY OF THE INVENTION

It is a first object of the present invention to provide a diffraction grating in which the controllability of the polarization-mode dependency is improved.

It is a second object of the present invention to provide an optical semiconductor device in which the controllability of the polarization-mode dependency of the diffraction grating is improved and which can provide a semiconductor laser that can operate as a stable polarization-mode switchable semiconductor laser or an optical amplifier with a reduced polarization-mode dependency, for example.

It is a third object of the present invention to provide a transmitter including the polarization-mode switchable semiconductor laser of the present invention.

It is a fourth object of the present invention to provide a receiver including the optical amplifier of the present invention.

It is a fifth object of the present invention to provide an optical transmission system which includes a transmitter including the polarization-mode switchable semiconductor laser of the present invention.

The invention is first directed to a diffraction grating which includes first regions whose coupling coefficient for first polarized light is larger than the coupling coefficient for second polarized light, and second regions whose coupling coefficient for the second polarized light is larger than the coupling coefficient for the first polarized light. The first regions and the second regions are alternately arranged in a light propagation direction.

The first regions disposed at intervals serve as a diffraction grating mainly for the first polarized light and the second regions complementarily disposed at intervals serve as a diffraction grating mainly for the second polarized light. In this structure, a difference between reflection factors (the reflection factor increases and decreases as the coupling coefficient increases and decreases, respectively) for the different polarized light can be appropriately set, so that the controllability of the polarization-mode dependency is improved.

The first regions and the second regions are formed by periodically arranging materials of predetermined amounts of strain (including non-strained material) in the light propagation direction, or by depositing materials of at least two amounts of strain (including non-strained material) in a direction of layer thickness and/or the light propagation direction, for example. Further, the first regions and the second regions are respectively formed of semiconductor materials, a tensile strain is introduced into at least the first regions and the amount of strain in the first regions is different from the amount of strain (including non-strain) in the second regions, for example.

The invention is further directed to an optical semiconductor device which includes a semiconductor substrate, a laser structure and a diffraction grating formed in the laser structure. The laser structure is one of a distributed feedback semiconductor laser structure and a distributed Bragg reflector semiconductor laser structure formed on the semiconductor substrate. The diffraction grating is formed of first regions, whose coupling coefficient for first polarized light is larger than the coupling coefficient for second polarized light, and second regions whose coupling coefficient for the second polarized light is larger than the coupling coefficient for the first polarized light. The first regions and the second regions are alternately arranged in a light propagation direction.

The first regions and the second regions of the diffraction grating can be formed in various manners. For example, the first regions and the second regions are formed of at least two materials having different amounts of strain and deposited with the first region and the second regions alternately increasing and decreasing continuously (for example, in the form of a sinusoidal wave) or discontinuously (for example, in the form of a square wave).

Specifically, the following configurations can be adopted in the optical semiconductor device of this invention:

The at least two materials having different amounts of strain comprise semiconductor materials having lattice constants different from or equal to a lattice constant of the substrate, and a difference between the lattice constant of the substrate and the lattice constant of each portion of the diffraction grating obtained by averaging along its layering (layer thickness) direction varies periodically in the light propagation direction. For example, the periodically appearing tensile-strained regions (a portion whose lattice constant is smaller than that of the substrate) serve as a diffraction grating having a major reflection factor (or coupling coefficient) for light in the TM mode, while the periodically appearing compressively-strained regions (a portion whose lattice constant is larger than that of the substrate) or non-strained regions serve as a diffraction grating having a major reflection factor (or coupling coefficient) for light in the TE mode. In this structure, those major reflection factors for light in the TE mode and the TM mode can be set with good controllability.

The first regions and the second regions are respectively formed of semiconductor materials, a tensile strain is introduced into at least the first regions and the amount of strain in the first regions is different from the amount of strain in the second regions. In this case, the diffraction grating can be formed by periodically arranging the regions having different lattice constants (larger than, smaller than or equal to the lattice constant of the substrate) in the cavity direction. According to this structure, the diffraction grating has a relatively simple structure, so that the device can be readily fabricated.

At least one of the first region and the second region is formed of a strained quantum well structure layer. As such semiconductor material, a tensile-strained or compressively-strained quantum well structure can be used. In this structure, the strained quantum well structure makes it possible to form the strained portion with a relatively thick layer-thickness, and hence the depth of the diffraction grating can be increased. That is, in the fabrication of the diffraction grating, the degree of a freedom for the depth and the like can be enhanced. Further, the polarization-mode dependency due to the strain can be enlarged. As a result, the efficiency of the optical semiconductor device, which can serve as the polarization-mode switchable laser, for example, can be improved.

The first regions and the second regions of the diffraction grating also comprises an active layer to construct a gain-coupling type distributed feedback optical semiconductor device, which is a gain-coupling DFB-LD whose polarization mode can be readily switched, for example. In this structure, th entire cavity enables the DFB modes in the TE mode and the TM mode to be stimulated, and the grating for the TE mode is spatially shifted from the grating for the TE mode in the cavity direction. Therefore, the entire photon-distribution in the device can be equalized, and fluctuation of carriers therein is small during the polarization switching operation between the TE mode and the TM mode. Thus, chirping can be reduced even at the time of high-speed modulation.

The alternate arrangement of the first regions and the second regions is inverted in its phase halfway to form a phase shift section in the diffraction grating. According to this structure, the device can highly stably operate.

An active layer, a phase control layer and the diffraction grating are arranged in the light propagation direction to construct a distributed Bragg reflector optical semiconductor device.

The invention is further directed to a light transmitter which includes the above optical semiconductor device of this invention constructed as a semiconductor laser, a polarization-mode selecting unit for selecting light in one of two different polarization modes emitted from the semiconductor laser, and a control unit for controlling the polarization mode of the light emitted from the semiconductor laser in accordance with an input signal supplied to the control unit.

The invention is further directed to a light receiver which includes the above optical semiconductor device of this invention constructed as an optical amplifier, and a light receiving unit for receiving light amplified and filtered by the optical amplifier.

The invention is further directed to an optical communication system for communicating over a light transmission line that transmits signals from a transmitter side to a receiver side. The system includes the above light transmitter of this invention and a light receiver for detecting the light in one of the two different polarization modes transmitted through the light transmission line, which is disposed on the receiver side. A coupling unit for coupling light in one of the two different polarization modes from the semiconductor laser to the light transmission line may also be arranged. In this optical communication system, the light transmitter may be constructed such that optical signals of different wavelengths can be transmitted therefrom and a wavelength division multiplexing network is built.

These advantages and others will be more readily understood in connection with the following detailed description of the preferred embodiments in conjunction with the drawings.

DESCRIPTION OF THE PREFERRED EMBODIMENT

First Embodiment

Figure 1:
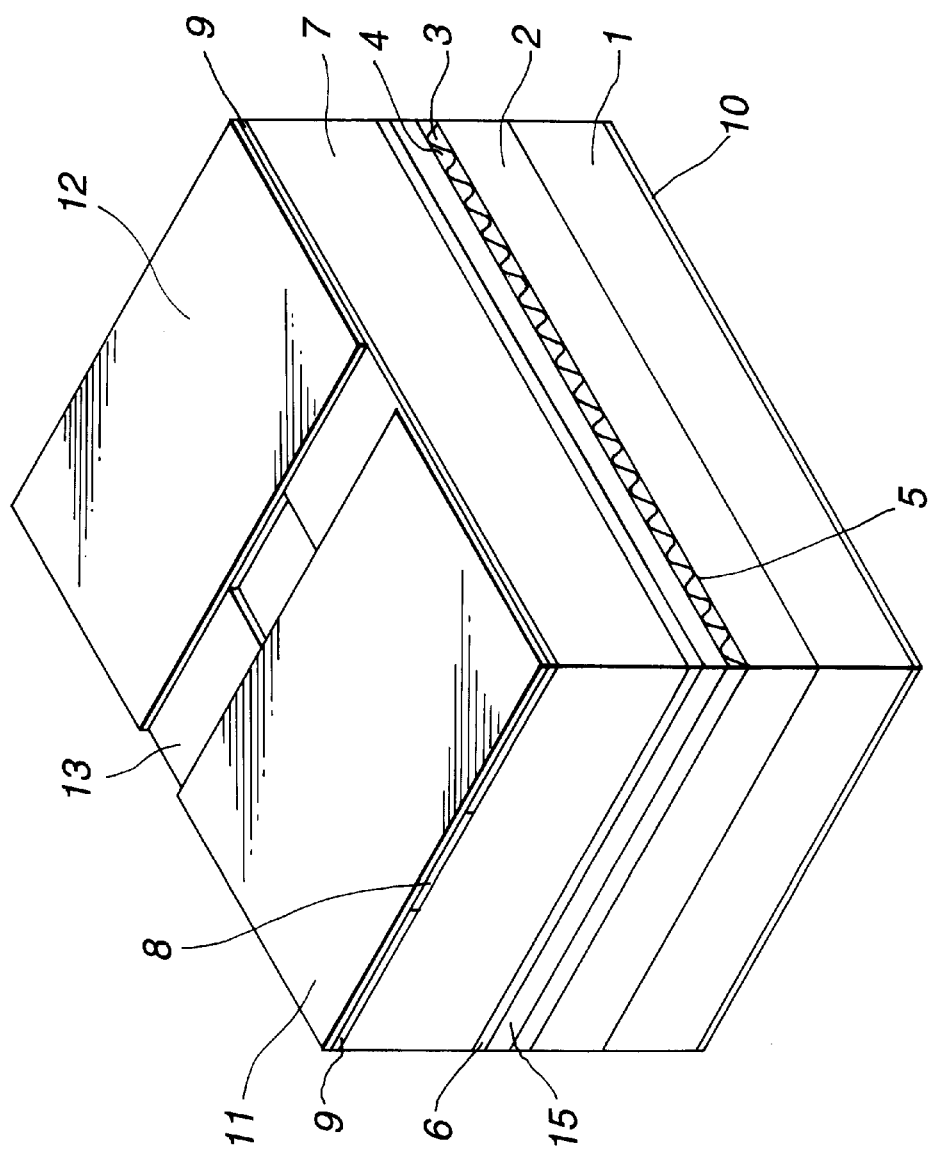
FIG. 1 is a perspective view illustrating the structure of an optical semiconductor device of a first embodiment according to the present invention.

A first embodiment of the present invention will be described with reference to FIGS. 1 and 2. In FIG. 1, reference numeral 1 denotes an n-type InP. Reference numeral 2 denotes an n-type InP cladding layer. Reference numeral 3 denotes a first strained layer of undoped InGaAsP whose lattice constant is smaller than that of the substrate 1 and whose energy bandgap wavelength and tensile-strain amount are respectively 1.3 $\mu$m and 0.5%. Reference numeral 4 denotes a second strained layer of undoped InGaAsP whose lattice constant is larger than that of the substrate 1 and whose bandgap wavelength and compressive-strain amount are respectively 1.3 $\mu$m and 0.5%. Reference numeral 15 denotes a light guide layer of undoped InGaAsP whose bandgap wavelength is 1.3 $\mu$m. Reference numeral 6 denotes an active layer of undoped InGaAsP whose bandgap wavelength is 1.56 $\mu$m. Reference numeral 7 denotes a second cladding layer of p-type InP. Reference numeral 8 denotes a cap layer of p-type InGaAs. Reference numeral 9 denotes an insulating layer. Reference numerals 10, 11 and 12 respectively denote first, second and third electrodes. Reference numeral 13 denotes a separating portion for electrically separating the second electrode 11 from the third electrode 12, which is formed by removing the cap layer 8. Further, reference numeral 5 denotes a diffraction grating formed on an interface between the first strained layer 3 and the second strained layer 4. In this embodiment, the interface between the first strained layer 3 and the second strained layer 4 has a sinusoidal-wave shape. A ratio between the first strained layer 3 and the second strained layer 4 in a period is appropriately set such that the following threshold competitive state can be established.

In the thus-fabricated structure, a difference between the lattice constant of the substrate and the lattice constant of a portion of the diffraction grating obtained by averaging in its layering direction varies periodically in the light propagation or cavity direction, and thus first regions for mainly reflecting first polarized light and second regions for mainly reflecting second polarized light are alternately arranged in the light propagation direction to form the diffraction grating.

The sinusoidal-wave diffraction grating 5 is formed by uniformly forming the first strained layer 3, etching the first strained layer 3 under an appropriate condition after a patterning process by using a conventional two-beam interference exposure method and then laying the second strained layer 4 thereon, for example.

The operation of the first embodiment will be described. When currents are respectively injected into portions between the first electrode 10 and the second electrode 11 and between the first electrode 10 and the third electrode 12, induced emission and resonance due to the feedback function of the diffraction grating 5 occur and light is oscillated. At this time, amplification factors for the TE mode and the TM mode are approximately the same in the bulk active layer 6. The diffraction grating 5 is formed by the first and second strained layers 3 and 4 having different amounts of strain, as discussed above, so that the tensile-strained first strained layer 3 having a major refractive index for the TM mode exhibits the feedback function or reflection for the TM mode which is substantially the same as that for the TE mode that the compressively-strained second strained layer 4 with a major refractive index for the TE mode exhibits. In this state, the threshold of light in the TE mode competes with the threshold of light in the TM mode. Therefore, the oscillation polarization mode can be switched between the TE mode and the TM mode by varying the round-trip phase for the TE mode and the TM mode by controlling a difference or ratio between the amounts of current injected through the second and third electrodes 11 and 12. Thus, the polarization mode of the semiconductor laser of this embodiment can be stably modulated with a reduced chirping by a small-amplitude modulation current superimposed on a bias current injected through at least one of the two electrodes 11 and 12.

Figure 2:
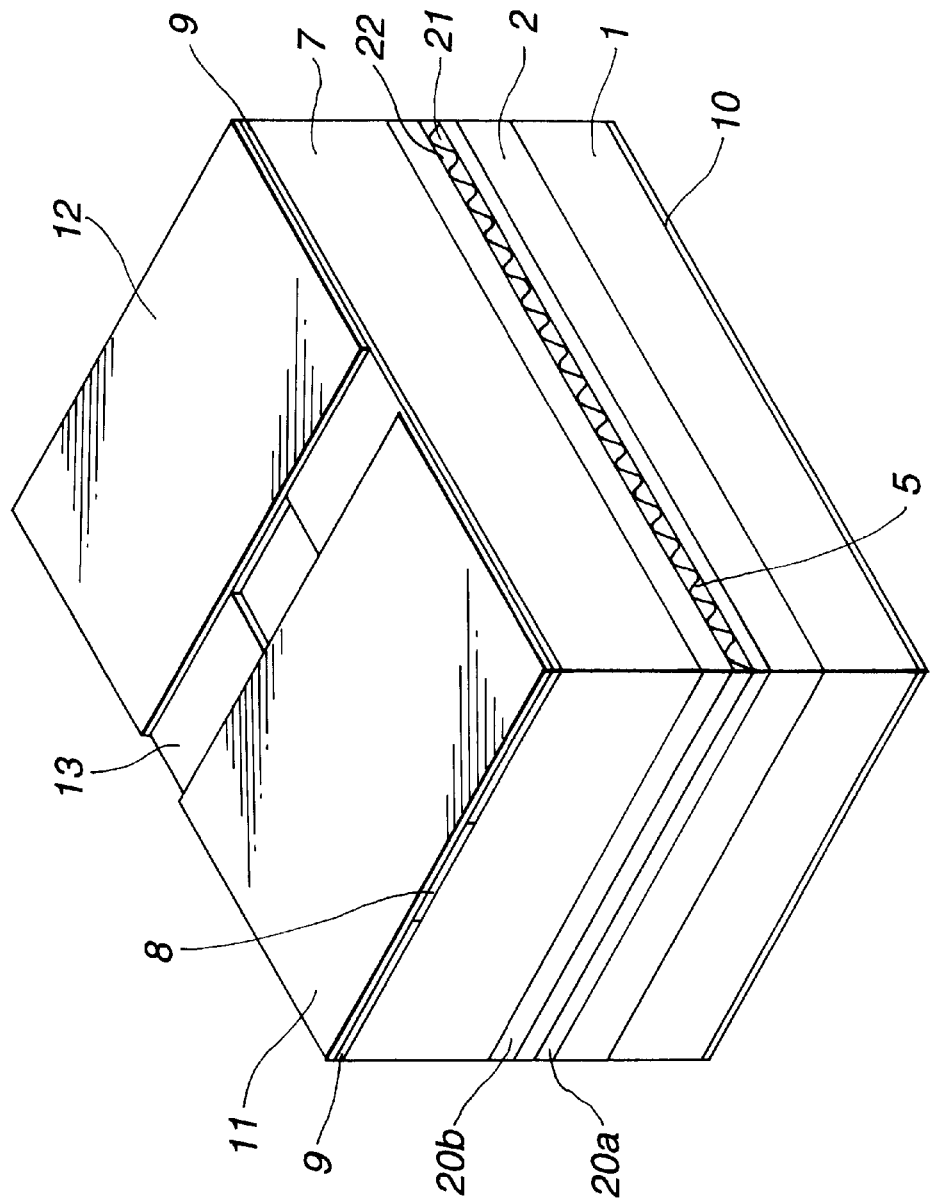
FIG. 2 is a perspective view illustrating the structure of an optical semiconductor device of a modification of the first embodiment according to the present invention.

FIG. 2 illustrates a modification of the first embodiment illustrated in FIG. 1. In FIG. 2, the same elements as those in FIG. 1 are denoted by the same reference numerals. In this modification of FIG. 2, strained layers above and under the grating 5 are respectively formed by strained quantum well layers 21 and 22. The strained layer 21 consists of at least one well layer and at least one barrier layer, and at least one of the well layer and the barrier layer has a tensile strain. The strained layer 22 consists of at least one well layer and at least one barrier layer, and at least one of the well layer and the barrier layer has a compressive strain. This diffraction grating 5 of the strained quantum well layers 21 and 22 can also be formed by the same method as discussed above.

Reference numerals 20a and 20b respectively designate lower and upper light guide layers. In this structure, the strained quantum well layers 21 and 22 also serve as an active layer, and respectively constitute a gain-coupling DFB laser diode (LD) for the TM mode and a gain-coupling DFB-LD for the TE mode. The duty ratio of the diffraction grating 5 (a ratio between portions in a period occupied by the two strained quantum well layers 21 and 22) is adjusted such that total threshold values for the two polarization modes, including the feedback by the distributed feedback, compete with each other. The operation of this modification of FIG. 2 is substantially the same as that of the first embodiment.

Second Embodiment

Figure 3:
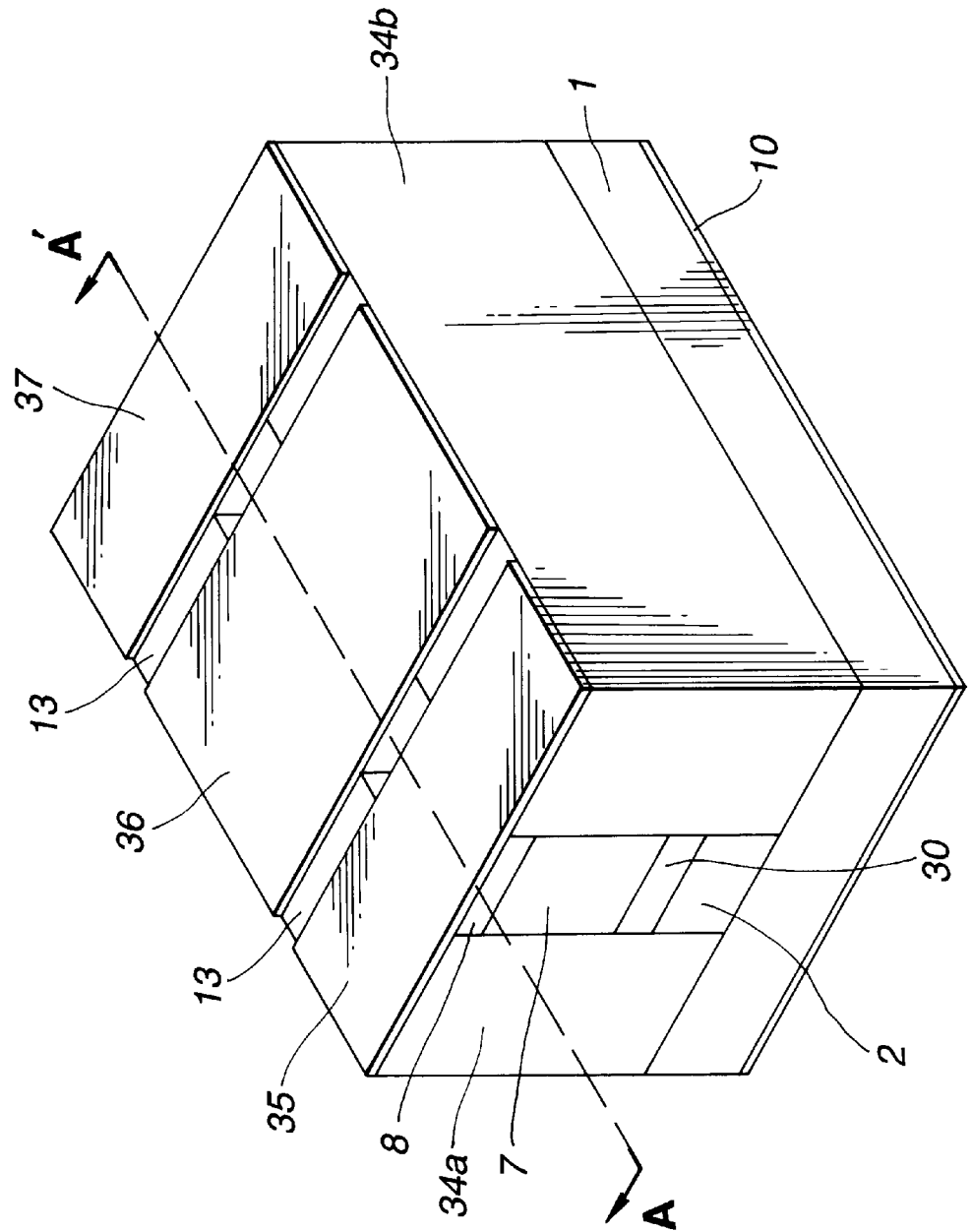
FIG. 3 is a perspective view illustrating the structure of an optical semiconductor device of a second embodiment according to the present invention.
Figure 4:
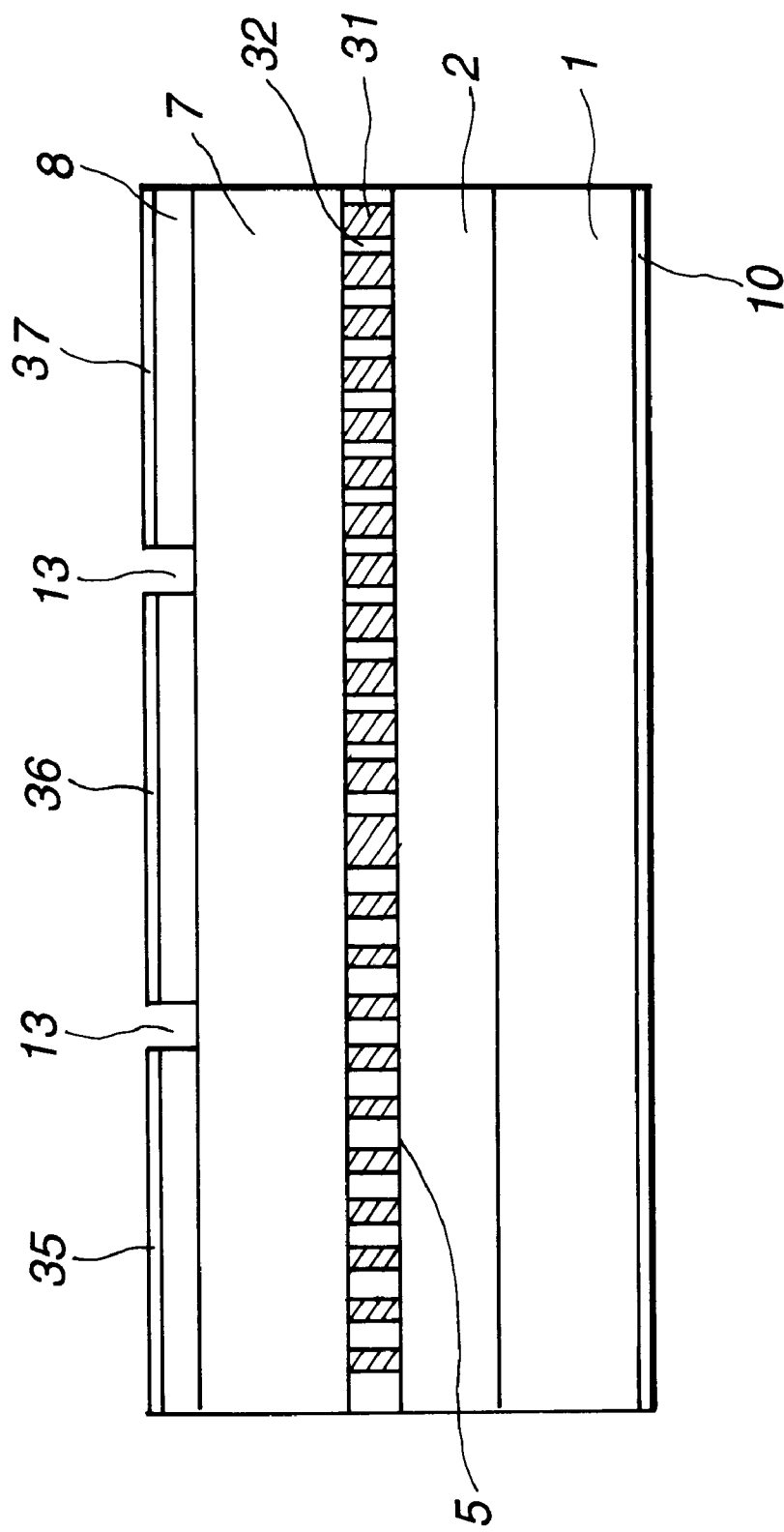
FIG. 4 is a cross-sectional view along a cavity direction of the device illustrating the second embodiment taken along the line A–A' in FIG. 3.

A second embodiment of the present invention will be described with reference to FIGS. 3 and 4. FIG. 3 illustrates the entire structure of a device of this embodiment, and FIG. 4 illustrates a cross-sectional structure of this embodiment taken along the line A–A' in FIG. 3. In FIGS. 3 and 4, elements having the same functions as those in the first embodiment are designated by the same reference numerals in FIG. 1.

The device illustrated in FIG. 3 includes a buried structure, and burying layers 34a and 34b of high-resistance InP are used in this embodiment. An active layer 30 is constructed by alternately forming two kinds of strained quantum well layers as illustrated in FIG. 4. In the second embodiment, tensile-strained and compressively-strained quantum well layers 31 and 32 are used, similar to the modification of the first embodiment. Further, as is seen from FIG. 4, a ratio between the first and second strained quantum well layers 31 and 32 in a period of the diffraction grating is inverted at a central portion of the device, so that the effect of the λ/4 phase shift section is attained. The diffraction grating 5 has a square-wave shape. This diffraction grating 5 can be formed by a method which is similar to that of the first embodiment and in which the etching condition and the like are a little changed.

The operation of the device of the second embodiment is substantially the same as that of the first embodiment. When the amount of current injected through a third electrode 36 on the λ/4 phase shift region is modulated in a state in which direct currents are injected into regions between the first electrode 10 and a second electrode 35 and between the first electrode 10 and a fourth electrode 37, the round-trip phases for the TE mode and the TM mode are varied accordingly. Thus, the oscillation polarization mode of the device is switched between the TE mode and the TM mode.

Figure 5:
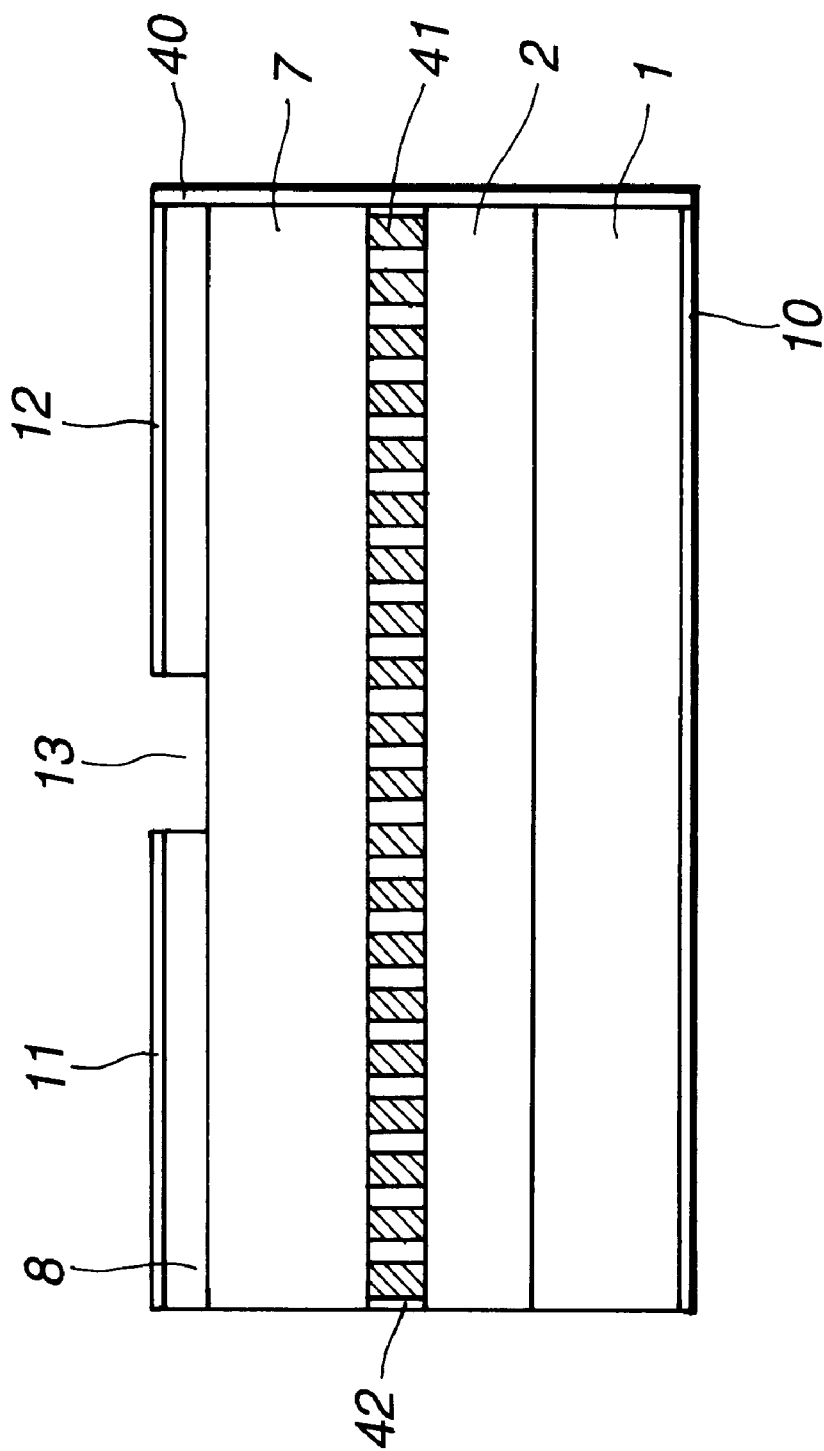
FIG. 5 is a cross-sectional view along a cavity direction of the device illustrating a modification of the second embodiment according to the present invention.

FIG. 5 illustrates a modification of the second embodiment. This modification is constructed by applying the structure of FIGS. 3 and 4 to the structure of FIG. 2. This modification is different from the structure of FIG. 4 in the number of electrodes and in that the phase of the diffraction grating 5 formed of first and second strained quantum well layers 41 and 42 is not inverted. The operation of this device is substantially the same as that of the first embodiment. In FIG. 5, reference numeral 40 designates an antireflection coating for further improving the controllability of the polarization-mode dependency of the reflection factor.

Third Embodiment

Figure 6:
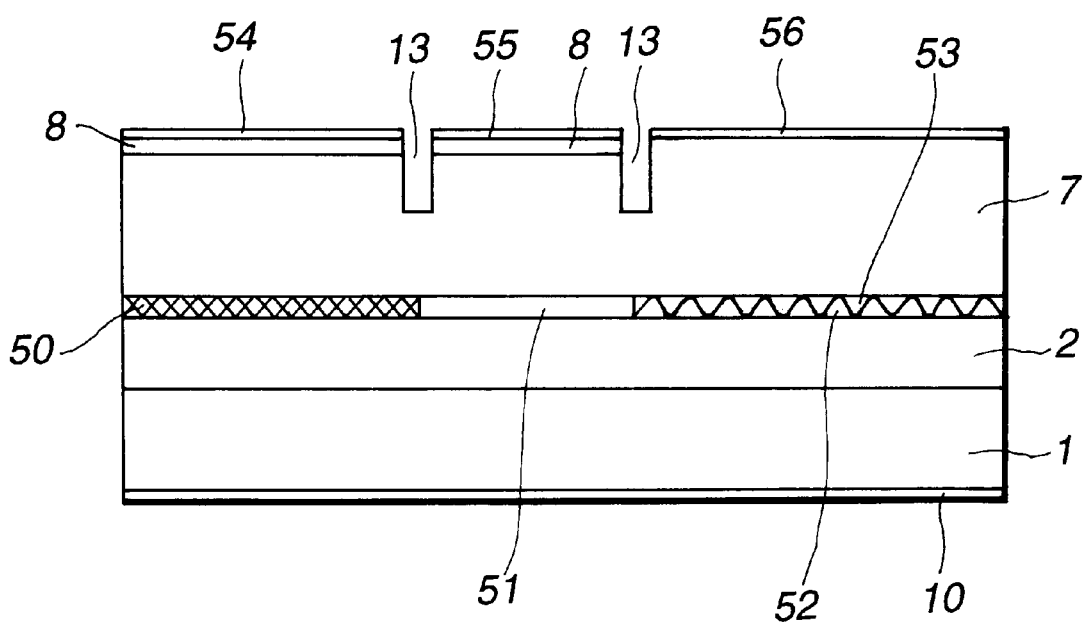
FIG. 6 is a cross-sectional view along a cavity direction of the device illustrating an optical semiconductor device of a third embodiment according to the present invention.

A third embodiment of the present invention will be described with reference to FIG. 6. FIG. 6 illustrates a cross-sectional structure of this embodiment similar to FIGS. 4 and 5. The third embodiment adopts a buried structure similar to FIG. 3, as a control structure in a lateral direction.

In FIG. 6, the same elements as those in FIGS. 1 to 5 are designated by the same reference numerals therein. Newly-designated elements are an undoped InGaAsP active layer 50 whose energy bandgap wavelength is 1.55 μm, a phase control layer 51 of undoped InGaAsP whose bandgap wavelength is 1.15 μm, a first stained quantum well layer 52 into which a tensile strain is introduced, a second stained quantum well layer 53 into which a compressive strain is introduced, and electrodes 54 to 56 respectively formed above the active layer 50, the phase control layer 51 and the strained quantum well layers 52 and 53. The basic structure of the third embodiment is a distributed Bragg reflector type semiconductor laser. Therefore, when current is injected into the active layer 50 through the second electrode 54, light is reflected by the distributed reflector constructed by the alternately-formed first and second strained quantum well layers 52 and 53 in a sinusoidal-wave shape. Thus, oscillation occurs by adjusting the phase of reflected light by the phase control layer 51.

In this embodiment, similar to the first embodiment, reflections of light in the TE mode and the TM mode by the diffraction grating can be independently set, so that the polarization-mode dependency can be adjusted more freely than a conventional device. For example, this polarization-mode dependency can be reduced. Due to this feature, the oscillation polarization mode can be stably switched between the TE mode and the TM mode by the phase control layer 51 into which a modulation current is injected.

In the above-discussed embodiments, the diffraction grating is formed by alternately arranging the tensile-strained regions and compressively-strained regions (each of them may be formed of material with a single amount of strain or materials of at least two amounts of strain), but the present invention is not limited to such a structure. Since a non-strained state is in general likely to reflect light in the TE mode, the diffraction grating can be formed by alternately arranging tensile-strained regions and non-strained regions. In this case, there is no need that the non-strained region has a quantum well structure. Further, even in the tensile-strained region, light in the TE mode is principally reflected if the amount of strain is small, for example. Therefore, the diffraction grating can be formed by alternately arranging largely tensile-strained regions, into which a sufficiently-large tensile strain is introduced to principally reflect light in the TM mode, and slightly tensile-strained regions, into which a small tensile strain is introduced to principally reflect light in the TE mode (i.e., only an insufficient tensile strain is introduced not to principally reflect light in the TM mode).

In other words, in the present invention, the diffraction grating only needs to be formed by alternately arranging first regions for mainly reflecting light in a first polarization state and second regions for mainly reflecting light in a second polarization state. The first and second polarization states are the TE mode and the TM mode, where the above-discussed waveguide type structure is adopted and the strength of light confinement in the waveguide has an anisotropy with respect to the direction of an electric field of the light.

Further, in order to construct a laser using such a diffraction grating and stably and readily achieve the polarization-mode switching, it is desirable that threshold values for the two polarization modes compete with each other. Factors for determining the threshold are the gain of the active layer, loss in the laser cavity, the reflection factor of the diffraction grating, the positional relationship between the distribution of a gain spectrum and a wavelength at which loss is minimum, and the like. Those factors vary depending on the polarization mode, so that laser's design can be variously made. Specifically, in the present invention, a single diffraction grating serves as a diffraction grating for the first polarization mode and a diffraction grating for the second polarization mode, and the reflection factors of the respective diffraction gratings can be appropriately designed. Further, it is possible to appropriately set a difference between the effective reflection factors of the two diffraction gratings by controlling the duty and thicknesses of the respective regions. Therefore, the degree of a freedom in the laser's design can be increased. Hence, even when the gains of the active layer for the two polarization modes can not be made competitive with each other, the reflection factors for the two polarization modes can be set such that this gain difference can be compensated for in the diffraction grating.

Furthermore, in the above-discussed embodiments, the device can be used as an optical amplifier by slightly modifying the structure (for example, antireflection coatings are provided on both opposite end facets, and the plural upper electrodes are formed into a single electrode) and changing the operation conditions (for example, current less than the threshold is injected). In this amplifier, a difference between the amplification factors due to the polarization state of input light, i.e., the polarization-mode dependency of the amplification factor, is reduced.

Fourth Embodiment

Figure 7:
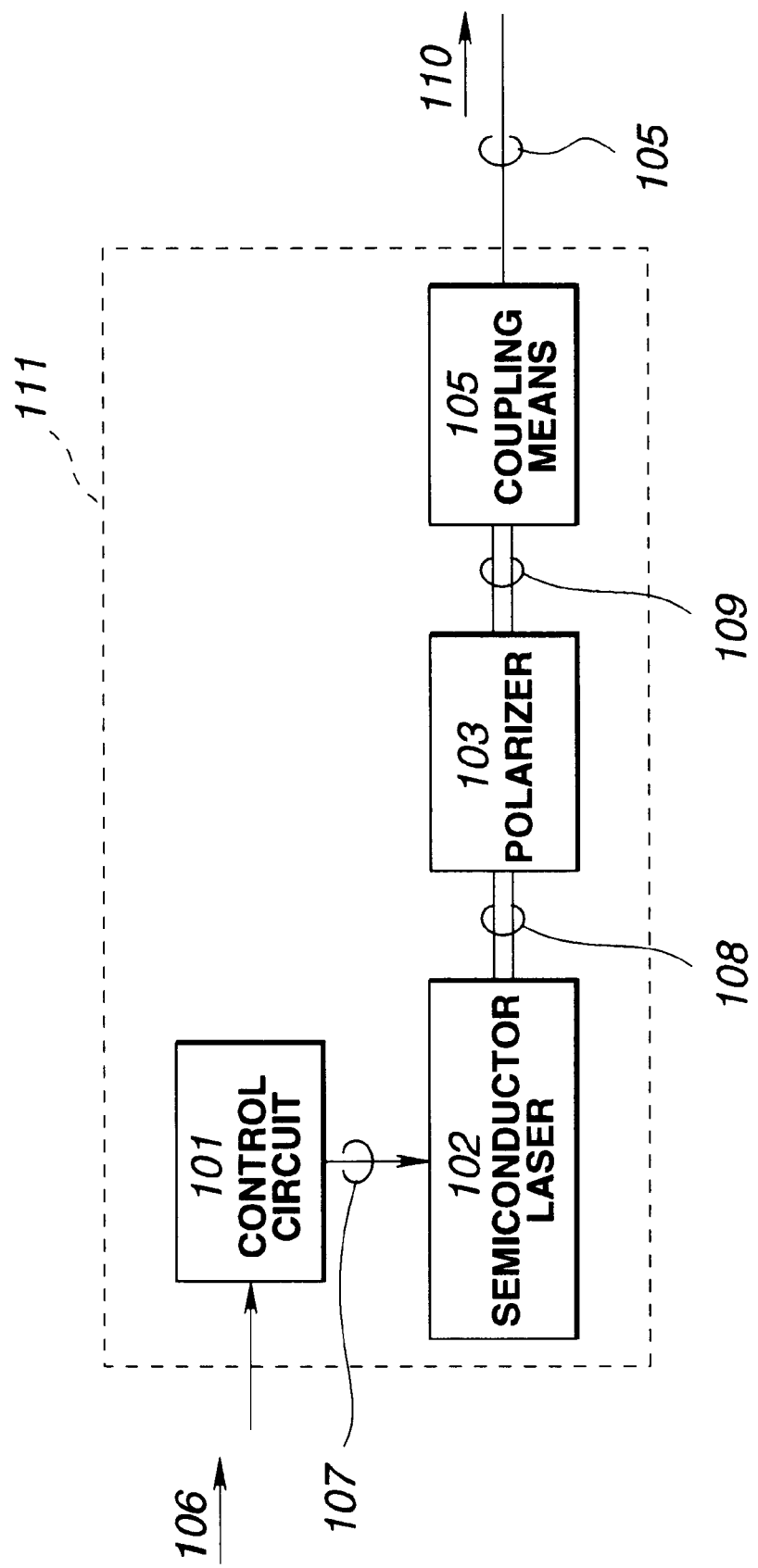
FIG. 7 is a block diagram illustrating an embodiment of an optical transmitter which includes a semiconductor laser constructed in accordance with the present invention.

In FIG. 7, an embodiment of a light transmitter including a semiconductor laser of this invention is illustrated. In FIG. 7, reference numeral 101 is a control circuit. Reference numeral 102 is a semiconductor laser constructed in accordance with this invention. Reference numeral 103 is a polarizer. Reference numeral 104 is an optical coupling means for coupling light transmitted in space to an optical fiber 105. Reference numeral 106 is an electric signal supplied from a terminal. Reference numeral 107 is a driving signal or signals supplied from the control circuit 101 to drive the semiconductor laser 102. Reference numeral 108 is a light signal output from the semiconductor laser 102 which is driven by the driving signal 107. Reference numeral 109 is a light signal from the polarizer 103 which is adjusted in the polarizer such that one of two components of the optical signal 108 having mutually-perpendicular polarization modes can be selected. Reference numeral 110 is an optical signal transmitted through the optical fiber 105. Reference numeral 111 is a light transmitter which uses the semiconductor laser 102 of this invention. In this embodiment, the transmitter 111 includes the control circuit 101, the semiconductor laser 102, the polarizer 103, the optical coupling means 104, the optical fiber 105 and the like.

The transmission operation of the light transmitter 411 of this embodiment will be described. When the electric signal 106 is supplied to the control circuit 101 from the terminal, the driving signal or signals 107 are supplied to the semiconductor laser 102 according to the modulation method as discussed above. The semiconductor laser 102 outputs the light signal 108 whose polarization state varies according to the driving signal 107. The light signal 108 is converted by the polarizer 103 to the light signal 109 in one of the two polarization modes, and coupled to the optical fiber 105 by the optical coupling unit 104. The thus-intensity-modulated light signal 110 is transmitted for communication.

In this case, since the light signal 110 is intensity-modulated, a conventional light receiver for intensity-modulation can be used to receive the light signal 110. Since the above-described semiconductor device can be used as a tunable semiconductor laser whose Bragg wavelength is controlled by controlling its bias current, the light transmitter 111 can also be employed in wavelength division multiplexing communications. In this case, a wavelength filter may be placed before a photodetector on the side of a receiver. In this embodiment, the apparatus is constructed as a light transmitter, but the apparatus can be used as a transmitter portion in a light transceiver.

The use of the thus-constructed transmitter is not limited to simple optical communication in which the communication is performed between two points. In other words, this transmitter can be used in any optical communication system that employs intensity-modulated signals, such as optical cable television (CATV) and optical local area networks (LAN) of any topology type (i.e., a bus type, a star type, a loop type and so forth).

Fifth Embodiment

Figure 8:
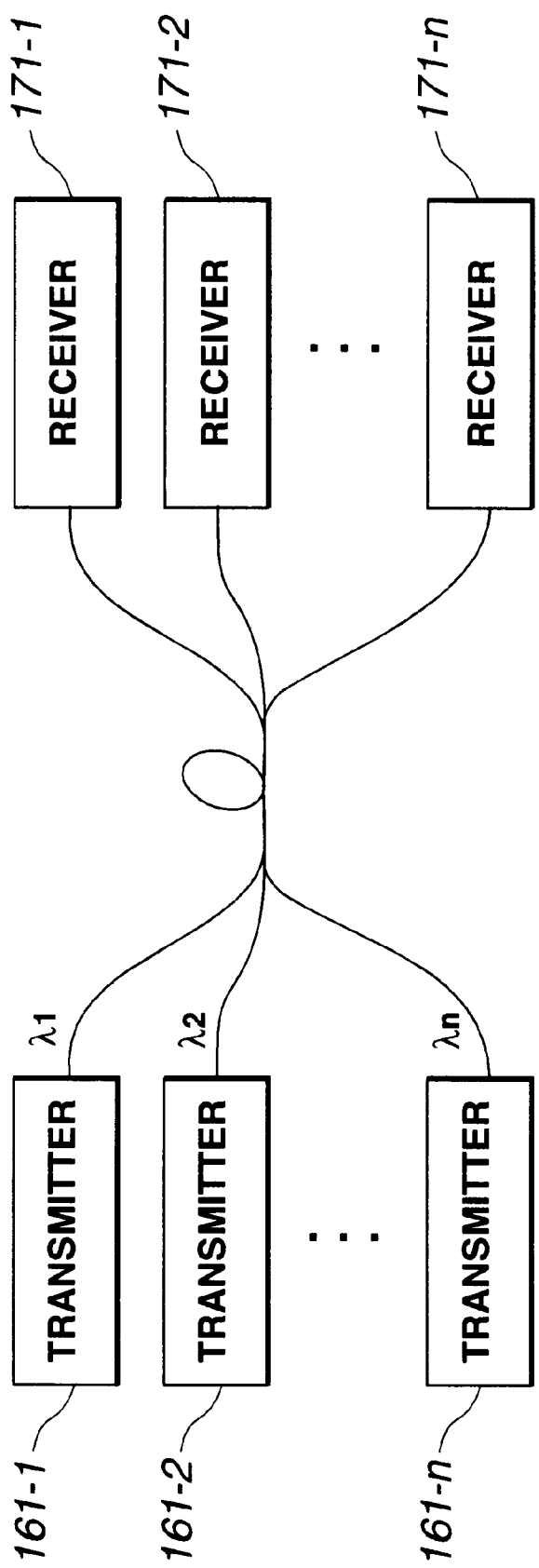
FIG. 8 is a block diagram illustrating an embodiment of a wavelength division multiplexing optical transmission system which uses an optical semiconductor device constructed in accordance with the present invention.

FIG. 8 illustrates a star type wavelength division multiplexing communication system in which a semiconductor optical device according to the invention is used. In FIG. 8, reference numerals 161-1 through 161-n are transmitters which respectively include oscillation polarization-mode switchable lasers and polarizers, and reference numerals 171-1 through 171-n are receivers which respectively include wavelength filters and photodetectors.

The output wavelength of the polarization switchable laser can be changed by controlling the bias current injected thereinto. This may be performed in the same manner as in an ordinary DFB-LD. In this embodiment, the wavelength multiplicity is ten (n=10) that is achieved by the transmitters 161-1 through 161-n whose output wavelengths are arranged with intervals of 1 Å. As the wavelength filter of the receiver 171, a DFB type waveguide filter is used. The DFB filters are constructed corresponding to the wavelength multiplicity, and have FWHWs (full-width at half maximum) of less than 0.5 Å. Thus, an optical signal of a desired wavelength can be selectively received at the receiver 171. In this embodiment, the device of the present invention constructed as an amplifier with a reduced polarization-mode dependency can be used as the filter therein.

As described above, an ASK (amplitude shift keying) signal with a large extinction ratio can be obtained by a small-amplitude modulation current in the combination structure of the polarization-mode switchable laser and the polarization selecting element located in front of the output portion of this laser. The spectral spread (i.e., chirping) at the modulation time can also be considerably lowered. Thus, a high-density wavelength division multiplexing, which could be conventionally attained only in FSK systems or external modulation systems, can be achieved.

As described in the foregoing, according to the present invention, reflection factors (or coupling coefficients) of the diffraction grating for the different polarization modes (typically, the TE mode and the TM mode) can be set independently from each other. Thus, the polarization-mode dependency can be highly freely adjusted, and a device with a small polarization-mode dependency can also be built. Therefore, thresholds for the different polarization modes can be made approximately equal to each other in the semiconductor laser, and the semiconductor laser can be polarization-modulated by a small operation current, for example.

Except as otherwise disclosed herein, the various components shown in outline or block form in the FIGS. are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A diffraction grating comprising:
    a semiconductor substrate;
    first regions formed of semiconductor materials and having first quantum well structures for mainly reflecting first polarized light, a strain is introduced into said first regions; and
    second regions formed of semiconductor materials and having second quantum well structures for mainly reflecting second polarized light, a strain is introduced into said second regions, wherein said first regions and said second regions are alternately arranged in a light propagation direction and the amount of strain in said first regions is different from the amount of strain in said second regions.

2. An optical semiconductor device comprising:
a semiconductor substrate;
a laser structure, said laser structure being one of a distributed feedback semiconductor laser structure and a distributed Bragg reflector semiconductor laser structure formed on said semiconductor substrate; and
a diffraction grating formed in said laser structure, said diffraction grating being formed of first regions having first quantum well structures for mainly reflecting first polarized light and second regions having second quantum well structures for mainly reflecting second polarized light, said first regions and said second regions being alternately arranged in a light propagation direction;
wherein a strain is introduced into both of said first regions and said second regions and the amount of strain in said first regions is different from the amount of strain in said second regions.

3. An optical semiconductor device comprising:
a semiconductor substrate;
a laser structure, said laser structure being one of a distributed feedback semiconductor laser structure and a distributed Bragg reflector semiconductor laser structure formed on said semiconductor substrate; and
a diffraction grating formed in said laser structure, said diffraction grating being formed of first regions for mainly reflecting first polarized light and second regions for mainly reflecting second polarized light, and said first regions and said second regions are alternately arranged in a light propagation direction, wherein said first regions and said second regions are formed of at least two materials having different amounts of strain and deposited with said first regions and said second regions alternately increasing and decreasing continuously or discontinuously.

4. An optical semiconductor device according to claim 3, wherein said at least two materials having different amounts of strain comprise semiconductor materials having lattice constants different from or equal to a lattice constant of said substrate, and a difference between the lattice constant of said substrate and the lattice constant of each portion of said diffraction grating obtained by averaging along its layering direction varies periodically in the light propagation direction.

5. An optical semiconductor device according to claim 2, wherein a tensile strain is introduced into said first regions and a compressive strain is introduced into second regions.

6. An optical semiconductor device according to claim 2, wherein an active layer is formed in a region, in which said diffraction grating is formed, to construct a distributed feedback optical semiconductor device.

7. An optical semiconductor device according to claim 6, wherein said first regions and said second regions of said diffraction grating also comprises said active layer to construct a gain-coupling type distributed feedback optical semiconductor device.

8. An optical semiconductor device comprising:
a semiconductor substrate;
a laser structure, said laser structure being one of a distributed feedback semiconductor laser structure and a distributed Bragg reflector semiconductor laser structure formed on said semiconductor substrate; and a diffraction grating formed in said laser structure, said diffraction grating being formed of first regions for mainly reflecting first polarized light and second regions for mainly reflecting second polarized light, and said first regions and said second regions are alternately arranged in a light propagation direction, wherein the alternate arrangement of said first regions and said second regions is inverted in its phase on its way to form a phase shift section in said diffraction grating.

9. An optical semiconductor device according to claim 3, wherein an active layer and said diffraction grating are arranged in the light propagation direction to construct a distributed Bragg reflector optical semiconductor device.

10. An optical semiconductor device according to claim 3, wherein a phase control layer is further arranged in the light propagation direction.

11. A light transmitter comprising:
an optical semiconductor device constructed as a semiconductor laser, said optical semiconductor device including a semiconductor substrate, a laser structure, said laser structure being one of a distributed feedback semiconductor laser structure and a distributed Bragg reflector semiconductor laser structure formed on said semiconductor substrate, and a diffraction grating formed in said laser structure, said diffraction grating being formed of first regions and second regions, said first regions being formed of semiconductor materials and having first quantum well structures for mainly reflecting first polarized light, said second regions being formed of semiconductor materials and having second quantum well structures for mainly reflecting second polarized light, wherein said first regions and said second regions are alternately arranged in a light propagation direction, a strain is introduced into both of said first regions and said second regions, and the amount of strain in said first regions is different from the amount of strain in said second regions;
polarization-mode selecting means for selecting light in one of two different polarization modes emitted from said semiconductor laser; and
control means for controlling the polarization mode of the light emitted from said semiconductor laser in accordance with an input signal supplied to said control means.

12. A light transmitter comprising:
an optical semiconductor device constructed as a semiconductor laser, said optical semiconductor device including a semiconductor substrate, a laser structure, said laser structure being one of a distributed feedback semiconductor laser structure and a distributed Bragg reflector semiconductor laser structure formed on said semiconductor substrate, and a diffraction grating formed in said laser structure, said diffraction grating being formed of first regions for mainly reflecting first polarized light and second regions for mainly reflecting second polarized light, said first regions and said second regions being alternately arranged in a light propagation direction;
polarization-mode selecting means for selecting light in one of two different polarization modes emitted from said semiconductor laser; and
control means for controlling the polarization mode of the light emitted from said semiconductor laser in accordance with an input signal supplied to said control means, wherein said first regions and said second regions are formed of at least two materials having different amounts of strain and deposited with said first regions and said second regions alternately increasing and decreasing continuously or discontinuously.

13. A light transmitter according to claim 12, wherein said at least two materials having different amounts of strain comprise semiconductor materials having lattice constants different from or equal to a lattice constant of said substrate, and a difference between the lattice constant of said substrate and the lattice constant of each portion of said diffraction grating obtained by averaging along its layering direction varies periodically in the light propagation direction.

14. A light transmitter according to claim 11, wherein an active layer is formed in a region, in which said diffraction grating is formed, to construct a distributed feedback optical semiconductor device.

15. A light transmitter according to claim 14, wherein said first regions and said second regions of said diffraction grating also comprises said active layer to construct a gain-coupling type distributed feedback optical semiconductor device.

16. A light transmitter comprising:
an optical semiconductor device constructed as a semiconductor laser, said optical semiconductor device including a semiconductor substrate, a laser structure, said laser structure being one of a distributed feedback semiconductor laser structure and a distributed Bragg reflector semiconductor laser structure formed on said semiconductor substrate, and a diffraction grating formed in said laser structure, said diffraction grating being formed of first regions for mainly reflecting first polarized light and second regions for mainly reflecting second polarized light, said first regions and said second regions being alternately arranged in a light propagation direction;
polarization-mode selecting means for selecting light in one of two different polarization modes emitted from said semiconductor laser; and
control means for controlling the polarization mode of the light emitted from said semiconductor laser in accordance with an input signal supplied to said control means, wherein the alternate arrangement of said first regions and said second regions is inverted in its phase on its way to form a phase shift section in said diffraction grating.

17. A light transmitter according to claim 11, wherein an active layer and said diffraction grating are arranged in the light propagation direction to construct a distributed Bragg reflector optical semiconductor device.

18. A light transmitter according to claim 17, wherein a phase control layer is further arranged in the light propagation direction.

19. A light receiver comprising:
an optical semiconductor device constructed as an optical amplifier, said optical amplifier including a semiconductor substrate, a laser structure, said laser structure being one of a distributed feedback semiconductor laser structure and a distributed Bragg reflector semiconductor laser structure formed on said semiconductor substrate, and a diffraction grating formed in said laser structure, said diffraction grating being formed of first regions and second regions, said first regions being formed of semiconductor materials and having first quantum well structures for mainly reflecting first polarized light, said second regions being formed of semiconductor materials and having second quantum well structures for mainly reflecting second polarized light, wherein said first regions and said second regions are alternately arranged in a light propagation direction, a strain is introduced into both of said first regions and said second regions, and the amount of strain in said first regions is different from the amount of strain in said second regions; and
light receiving means for receiving light amplified and filtered by said optical amplifier.

20. An optical communication system for communicating over a light transmission line that transmits signals form a transmitter side to a receiver side, said system comprising:
a light transmitter including:
an optical semiconductor device constructed as a semiconductor laser, said optical semiconductor device including a semiconductor substrate, a laser structure, said laser structure being one of a distributed feedback semiconductor laser structure and a distributed Bragg reflector semiconductor laser structure formed on said semiconductor substrate, and a diffraction grating formed in said laser structure, said diffraction grating being formed of first regions and second regions, said first regions being formed of semiconductor materials and having first quantum well structures for mainly reflecting first polarized light, said second regions being formed of semiconductor materials and having second quantum well structures for mainly reflecting second polarized light, wherein said first regions and said second regions are alternately arranged in a light propagation direction, a strain is introduced into both of said first regions and said second regions, and the amount of strain in said first regions is different from the amount of strain in said second regions;
polarization mode selecting means for selecting light in one of two different polarization modes emitted from said semiconductor laser; and
control means for controlling the polarization mode of the light emitted from said semiconductor laser in accordance with an input signal supplied to said control means; and
a light receiver for detecting the light in one of the two different polarization modes transmitted through the light transmission line, said receiver being disposed on the receiver side.

21. An optical communication system according to claim 20, wherein said light receiver includes:
an optical semiconductor device constructed as an optical amplifier, said optical amplifier including a semiconductor substrate, a laser structure, said laser structure being one of a distributed feedback semiconductor laser structure and a distributed Bragg reflector semiconductor laser structure formed on said semiconductor substrate, and a diffraction grating formed in said laser structure, said diffraction grating being formed of first regions for mainly reflecting first polarized light and second regions for mainly reflecting second polarized light, said first regions and said second regions alternately arranged in a light propagation direction; and
light receiving means for receiving light amplified and filtered by said optical amplifier.

22. An optical communication system according to claim 20, wherein said light transmitter is constructed such that optical signals of different wavelengths can be transmitted therefrom and a wavelength division multiplexing network is built.

* * * * *

UNITED STATES PATENT AND TRADEMARK OFFICE
CERTIFICATE OF CORRECTION

PATENT NO. : 5,926,497

DATED : July 20, 1999

INVENTOR(S) : JUN NITTA ET AL.

It is certified that error appears in the above-identified patent and that said Letters Patent is hereby corrected as shown below:

<u>ON TITLE PAGE, AT [56], REFERENCES CITED, FOREIGN PATENT DOCUMENTS</u>

"2159781" should read --2-159781--;
"5129719" should read --5-129719--.

<u>SHEET 7</u>

Replace Figure 7 with the following figure:

FIG.7

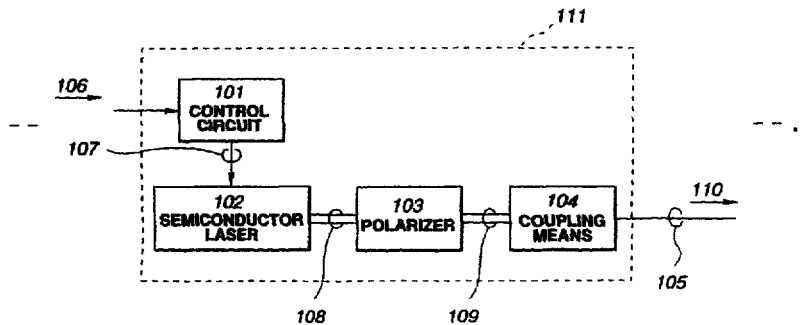

<u>COLUMN 2</u>

Line 42, close up right margin;
Line 43, close up left margin.

UNITED STATES PATENT AND TRADEMARK OFFICE
CERTIFICATE OF CORRECTION

PATENT NO.   : 5,926,497

DATED        : July 20, 1999

INVENTOR(S)  : JUN NITTA ET AL.

It is certified that error appears in the above-identified patent and that said Letters Patent is hereby corrected as shown below:

COLUMN 5

Line 19, "EMBODIMENT" should read --EMBODIMENTS--.

COLUMN 7

Line 49, "stained" should read --strained--;
   Line 50, "stained" should read --strained--.

COLUMN 8

Line 45, "laser's" should read --the laser's--;
   Line 53, "a" should be deleted.

COLUMN 9

Line 28, "transmitter 411" should read --transmitter 111-.

COLUMN 10

Line 43, "FIGS." should read --Figures--;
   Line 62, "is" should read --being--;
   Line 66, "is" should being --being--.

COLUMN 11

Line 58, "comprises" should read --comprise--.

COLUMN 12

Line 11, "claim 3," should read --claim 2,--;
   Line 15, "claim 3," should read --claim 2,--.

UNITED STATES PATENT AND TRADEMARK OFFICE
CERTIFICATE OF CORRECTION

PATENT NO.   :   5,926,497

DATED        :   July 20, 1999

INVENTOR(S)  :   JUN NITTA ET AL.

It is certified that error appears in the above-identified patent and that said Letters Patent is hereby corrected as shown below:

<u>COLUMN 13</u>

Line 18, "comprises" should read --comprise--.

<u>COLUMN 14</u>

Line 9, "form" should read --from--.

Signed and Sealed this

Sixth Day of June, 2000

Attest:

Q. TODD DICKINSON

Attesting Officer

Director of Patents and Trademarks